(12) United States Patent
Ho et al.

(10) Patent No.: US 6,995,474 B1
(45) Date of Patent: Feb. 7, 2006

(54) ELECTRICAL CONDUCTING STRUCTURE AND LIQUID CRYSTAL DISPLAY DEVICE COMPRISING THE SAME

(75) Inventors: Shu-Lin Ho, I-Lan Hsien (TW); Pao-Yun Tang, Tao-Yuan Hsien (TW)

(73) Assignee: HannStar Display Corp., Tao-Yuan Hsien (TW)

( * ) Notice: Subject to any disclaimer, the term of this patent is extended or adjusted under 35 U.S.C. 154(b) by 0 days.

(21) Appl. No.: 10/711,412

(22) Filed: Sep. 17, 2004

(30) Foreign Application Priority Data

Aug. 2, 2004 (TW) .............................. 93123107 A (51) Int. Cl.
*H01L 23/48* (2006.01)
*H01L 23/52* (2006.01)
*H01L 29/40* (2006.01)
(52) U.S. Cl. ..................................... 257/781; 257/780
(58) Field of Classification Search ................ 257/780, 257/781, 782, 758, 737; 349/149, 150
See application file for complete search history.

(56) References Cited

U.S. PATENT DOCUMENTS

| 5,309,025 | A | * | 5/1994 | Bryant et al. | ................ | 257/784 |
| 5,517,752 | A | | 5/1996 | Sakata et al. | | |
| 5,578,527 | A | | 11/1996 | Chang et al. | | |
| 6,111,628 | A | * | 8/2000 | Shiota et al. | ................ | 349/150 |
| 6,144,507 | A | * | 11/2000 | Hashimoto | .................. | 359/819 |
| 6,232,563 | B1 | * | 5/2001 | Kim et al. | .................. | 174/261 |
| 6,285,085 | B1 | * | 9/2001 | Taguchi | ...................... | 257/780 |
| 6,346,750 | B1 | * | 2/2002 | Jiang et al. | ................. | 257/783 |
| 6,348,739 | B1 | * | 2/2002 | Taguchi et al. | ............. | 257/778 |
| 6,537,854 | B1 | * | 3/2003 | Chang et al. | ................ | 438/118 |
| 6,577,001 | B2 | * | 6/2003 | Kobayashi | .................... | 257/737 |
| 6,734,568 | B2 | * | 5/2004 | Matsuo et al. | .............. | 257/781 |
| 2002/0048924 | A1 | | 4/2002 | Lay et al. | | |
| 2004/0048202 | A1 | | 3/2004 | Lay et al. | | |
| 2005/0017336 | A1 | * | 1/2005 | Kung et al. | ................. | 257/685 |

* cited by examiner

*Primary Examiner*—S. V. Clark
(74) *Attorney, Agent, or Firm*—Winston Hsu (57) ABSTRACT

An electrical conducting structure including an integrated circuit, a substrate, and a plurality of bumps, wherein at least one bump comprises a first conductive part connected to the integrated circuit at one end; a second conductive part connected to the integrated circuit at one end; a conductive connection part connecting the first conductive part and the second conductive part; a first insulation part surrounding the first conductive part and the second conductive part; and a second insulation part located between the first conductive part and the second conductive part.

35 Claims, 9 Drawing Sheets

ELECTRICAL CONDUCTING STRUCTURE AND LIQUID CRYSTAL DISPLAY DEVICE COMPRISING THE SAME

BACKGROUND OF THE INVENTION

1. Field of the Invention

The invention relates to a conducting structure, and more particularly, to a conducting structure with flexibility.

2. Description of the Prior Art

In the fabrication of liquid crystal displays, some of the module package techniques common used today includes tape automated bonding (TAB), chip on glass (COG), and chip on film (COF). In TAB, numerous bumps are utilized for connecting a polyimide board and a liquid crystal display panel via an anisotropic conductive film (ACF) after the driving chip is fabricated. The bumps are essentially metal blocks comprising gold or lead-tin alloy on the bonding pad of the chip and during fabrication, the bumps are melted to connect the bonding pad and the circuits together. In COG, driving chips with fabricated bumps are connected directly onto an LCD panel by an anisotropic conductive film via a flip chip package. In COF, the electrical circuit originally designed for the printed circuit board is positioned on the polyimide board together with the driving chip.

In the past, TAB has generally been utilized for fabricating larger LCD panels whereas COG has been used for fabricating medium to small size LCD panels. However in recent years, COG has been widely used for fabricating LCD panels of various sizes in order to reduce cost of the panels. Nevertheless, numerous problems that ultimately affect production yield and quality of display still remain when the existing COG technique is applied to LCD panel fabrication.

Figure 1:
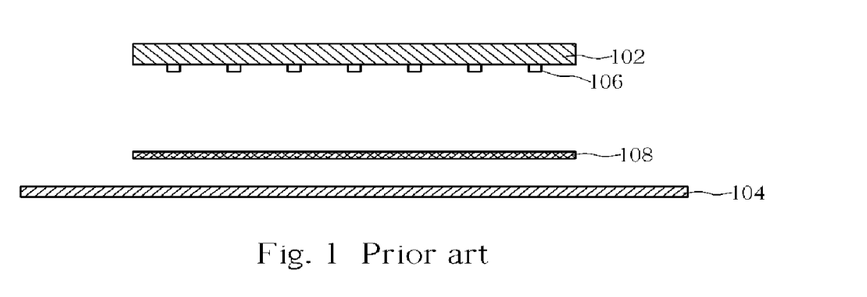
FIG. 1 is a schematic view of the COG technique according to the prior art.
Figure 2:
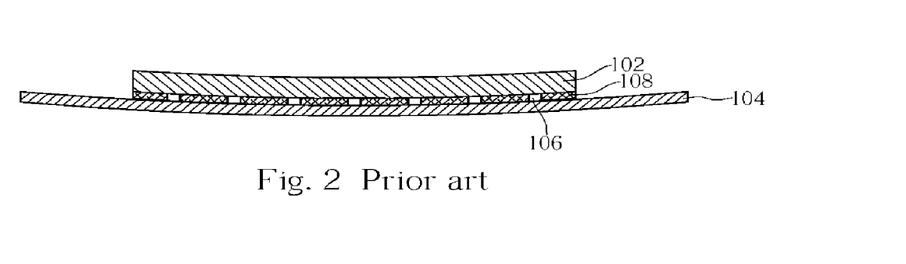
FIG. 2 is a schematic view of the bending phenomenon caused by the COG technique according to the prior art.

Please refer to FIG. 1. FIG. 1 is a schematic view of the COG technique according to the prior art. By fabricating bumps 106 on the pad of an integrated circuit 102 and utilizing an anisotropic conductive film 108 as the interface, the integrated circuit 102 can be smoothly connected onto an LCD panel 104. In general, the bumps 106 are composed of materials such as gold or lead-tin alloy and the anisotropic conductive film 108 is composed of materials including numerous conductive pellets. By melting the conductive pellets between the bumps 106 and the anisotropic conductive film 108 via a hot embossing fabrication, the integrated circuit 102 can be electrically connected to a connection pad on the LCD panel 104. A high temperature (160to 190°C.) is normally required to carry out the hot embossing fabrication, and because of the fact that the heat expansion coefficient between the integrated circuit 102 and the LCD panel 104 differs significantly, an enormous amount of stress is often generated at the contact surface when the temperature returns to normal. As shown in FIG. 2, the resulting stress often causes a bending phenomenon on the integrated circuit 102 and the LCD panel 104. Eventually, the phenomenon would further induce a curtain mura and degrade the overall quality of the display.

In the prior art COG technique, the smoothness of the LCD panel 104 becomes particularly important as the integrated circuit 102 and the LCD panel 104 are composed of hard and rigid materials. In general, the smoothness of the LCD panels must be controlled to within a range of ±0.5 $\mu$m and the smoothness requirements for larger LCD panels are even stricter. Essentially, an LCD panel with poor smoothness often results in a connection failure between the integrated circuit 102 and the LCD panel 104 and ultimately decreases the overall product yield.

Figure 3:
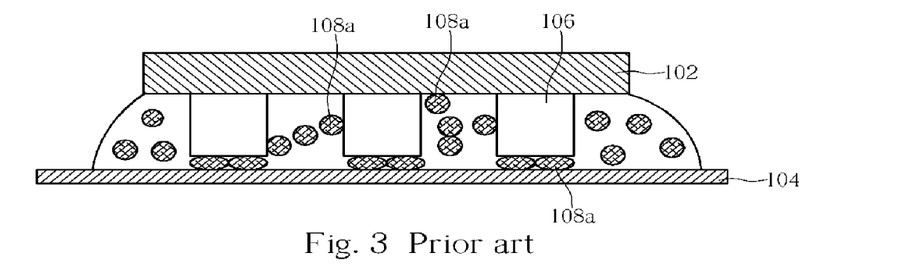
FIG. 3 is a schematic view of a short circuit condition caused by the COG technique according to the prior art.

Moreover, since the anisotropic conductive film that includes numerous conductive pellets is commonly used for connecting the integrated circuit 102 and the LCD panel 104, maintaining a safe distance between the bumps 106 therefore becomes a critically important matter for preventing a short circuit. Please refer to FIG. 3. FIG. 3 is a schematic view of the connection between the bump 106, conductive pellets 108a, and the integrated circuit 102 and LCD panel 104. If the distance between the bumps 106 is too short and the conductive pellets 108a are concentrated in one area, a short circuit will be occurred between the bumps 106 and it will decrease the product yield. According to the prior art about COG technique, a distance of more than 15 $\mu$m between the bumps 106 is generally required in order to control the probability of a short circuit to be within an acceptable range. As a result, the contact area between the integrated circuit and the LCD panel needs to be maintained above a certain size and it is an unavoidable challenge to reducing the size of the contact area.

SUMMARY OF INVENTION

It is therefore an objective of the present invention to provide a conductive structure with flexible bumps for effectively preventing the bending phenomenon between the integrated circuit and the LCD panel and problems such as curtain mura.

In addition, a second objective of the present invention is to provide a conductive structure with flexible bumps for increasing the tolerance level of Chip On Glass (COG) technique to the smoothness of the glass substrate.

The third objective of the present invention is to provide a conductive structure with bumps surrounded by an insulating layer for preventing short circuits and for reducing the contact area between the integrated circuit and the LCD panel.

According to the present invention, a conductive structure includes an integrated circuit, a substrate, and a plurality of bumps located between the integrated circuit and the substrate. At least one bump comprises a first conductive part connected to the integrated circuit at one end; a second conductive part connected to the integrated circuit at one end; a conductive connection part connecting the first conductive part and the second conductive part; a first insulation part surrounding the first conductive part and the second conductive part; and a second insulation part locating between the first conductive part and the second conductive part.

According to the present invention, a liquid crystal display comprises a substrate, a liquid crystal display region positioned in the center of the substrate, an integrated circuit positioned on the edge of the substrate, a plurality of bumps positioned between the substrate and the integrated circuit for electrically connecting the integrated circuit, and an anisotropic conductive film for providing an electrical connection between the bumps and the substrate. At least one bump comprises a first conductive part connected to the integrated circuit at one end; a second conductive part connected to the integrated circuit at one end; a conductive connection part connecting the first conductive part and the second conductive part; a first insulation part surrounding the first conductive part and the second conductive part; and a second insulation part locating between the first conductive part and the second conductive part.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
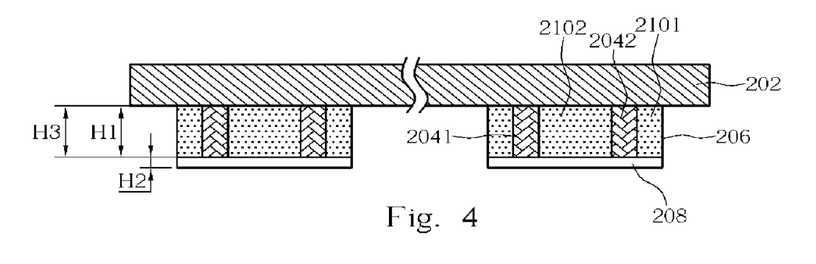
FIG. 4 is a schematic view of the means by which the bumps of the conductive structure are connected to the integrated circuit according to the present invention.
Figure 5:
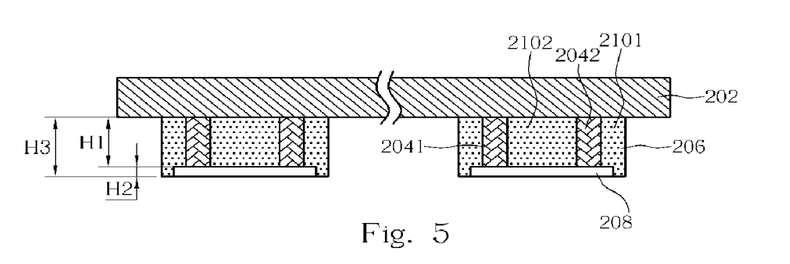
FIG. 5 is a schematic view of the means by which the bumps of the conductive structure are connected to the integrated circuit according to the present invention.

Please refer to FIG. 4 and FIG. 5. FIG. 4 and FIG. 5 are schematic views of the means by which the bumps of the conductive structure are connected to the integrated circuit according to the present invention. The bumps in FIG. 4 and FIG. 5 comprise a first conducting part 2041, a second conducting part 2042, a conductive connection part 208, and an insulation layer 206. The insulation layer 206 can be further divided into a first insulation part 2101 and a second insulation part 2102 based on its location of formation. One end of the first conductive part 2041 and one end of the second conductive part 2042 are connected to the integrated circuit 202, and the other ends of the two conductive parts are connected to the conductive connection part 208. The first conductive part 2041 and the second conductive part 2042 are surrounded by the first insulation part 2101. The second insulation part 2102 is located between the first conductive part 2041 and the second conductive part 2042.

During the fabrication of the conductive structure bumps, the insulation layer 206 is first formed on a contact of the integrated circuit 202 and two openings are formed on the insulation layer 206 to expose the contact of the integrated circuit 202. Then a first conductive part 2041 and a second conductive part 2042 are formed in the two openings. Thereafter, a conductive connection part 208 is formed on the first conductive part 2041 and the second conductive part 2042. The conductive connection part 208 is electrically connected to the integrated circuit 202 through the first conductive part 2041 and the second conductive part 2042. The insulation layer 206 is divided into the first insulation part 2101 and the second insulation part 2102. The first insulation part 2101 surrounds the first conductive part 2041 and the second conductive part 2042, whereas the second insulation part 2102 is located between the first conductive part 2041 and the second conductive part 2042. The insulation layer 206 comprises light-isolating materials such as polyimide (PI), a strong isolating material with flexibility. In order to form the first conductive part 2041 and the second conductive part 2042, an electroless fabrication method can be employed to form gold, nickel, gold alloy, or nickel alloy in the openings, and ultimately to electrically connect to the contact of the integrated circuit 202. In addition, the composition of the conductive connection part 208 is selected from materials such as gold or gold alloys.

In the preferred embodiment of the present invention, when the height of the first conductive part 2041 and the second conductive part 2042 is H1, the height of the conductive connection part 208 is H2, and the height of the first insulation part 2101 is H3, the relationship among the three heights becomes $H1 \leq H3 < H1+H2$. The condition where $H1=H3$ is shown in FIG. 4, while the condition where $H3=H1+H2$ is shown in FIG. 5.

Figure 6:
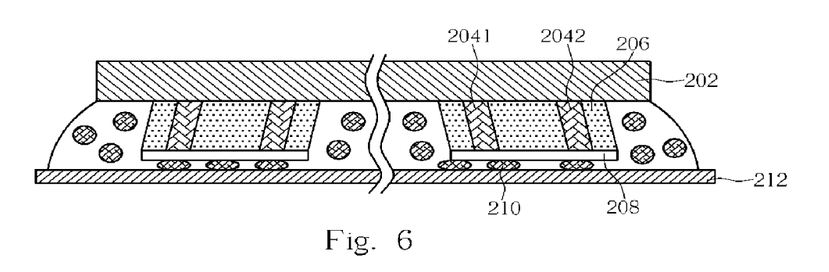
FIG. 6 is a schematic view of the conductive structure in which the bumps are connected to the integrated circuit and the glass substrate according to the present invention.

Please refer to FIG. 6. FIG. 6 is a schematic view of the conductive structure in which the bumps are connected to the integrated circuit and the glass substrate according to the present invention. In order to establish a connection between the integrated circuit 202 and the glass substrate 212, the integrated circuit 202 needs to be electrically connected to a contact pad on top of the glass substrate 212 via hot embossing fabrication by melting the conductive connection part 208 and the conductive pellets 210. After the integrated circuit 202 and the glass substrate 212 return to room temperature, the stress remaining in the contact surface is removed by a deformation of the bumps due to their flexible nature. As shown in FIG. 6, the bump is deformed into a trapezoid structure to remove the stress remaining in the horizontal direction. Consequently, the bending phenomenon of the integrated circuit 202 and the glass substrate 212 is greatly reduced and problems such as curtain mura can also be prevented.

Figure 7:
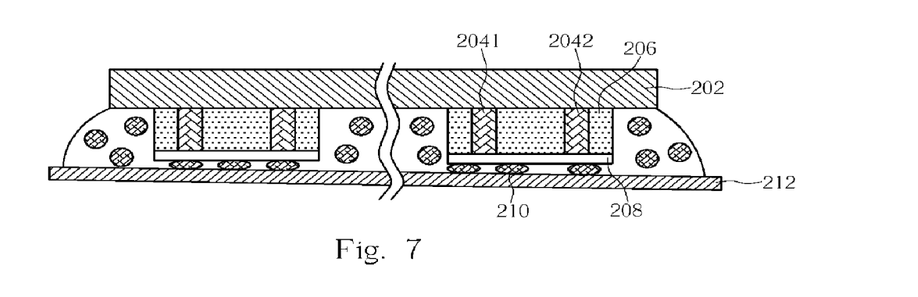
FIG. 7 is a schematic view of the conductive structure in which the bumps are connected to an uneven surface according to the present invention.

Please refer to FIG. 7. FIG. 7 is a schematic view of the conductive structure in which the bumps are connected to an uneven surface according to the present invention. The condition shown in FIG. 7 during the compression process is often caused by an uneven surface on the integrated circuit 202 and/or the glass substrate 212. Due to the compressible nature of the bumps and the fact that the insulation layer 206 is composed of a flexible material, the bumps are able to conform with the compression surface to a certain extent. By utilizing the bumps of the present invention, a greater tolerance level to the smoothness of the LCD panel is achieved and thus, the overall fabrication yield is increased.

Figure 8:
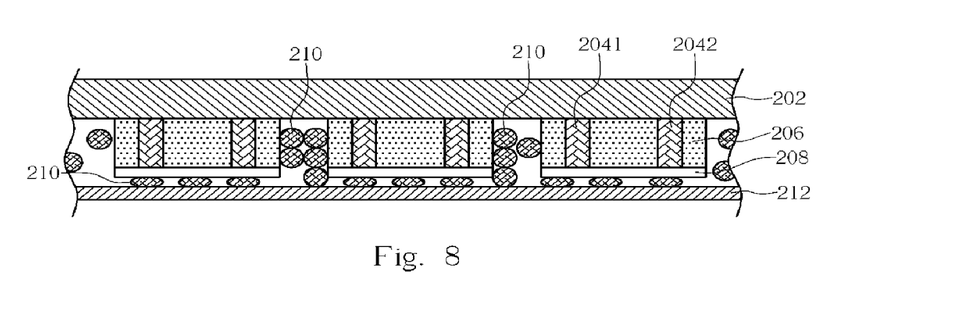
FIG. 8 is a schematic view of the conductive structure in which the distance between bumps is reduced according to the present invention.

Please refer to FIG. 8. FIG. 8 is a schematic view of the conductive structure in which the distance between bumps is reduced according to the present invention. Even when the distance between the bumps is reduced and the conductive pellets 210 are concentrated between two bumps, the bumps are still electrically insulated from each other due to the design of the insulation layer 206. As a result, the area of the contact region and the distance between the integrated circuit 202 and the glass substrate 21 2 can be greatly reduced. As shown in FIG. 8, the insulation layer 206 only separates the contact between the first conductive part 2041 and the second conductive part 2042 but not the neighboring conductive connection part 208. In another preferred embodiment, the insulation layer 206 can be extended downward to further protect the conductive connection part 208, as shown in FIG. 5.

Figure 9:
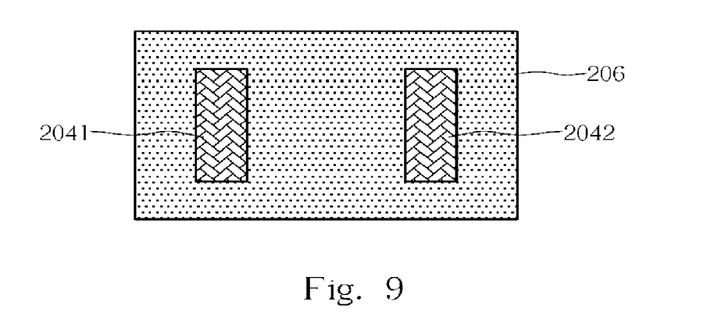
FIGS. 9, 10, and 11 show schematic upward views of the bumps of the conductive structure according to the present invention.
Figure 10:
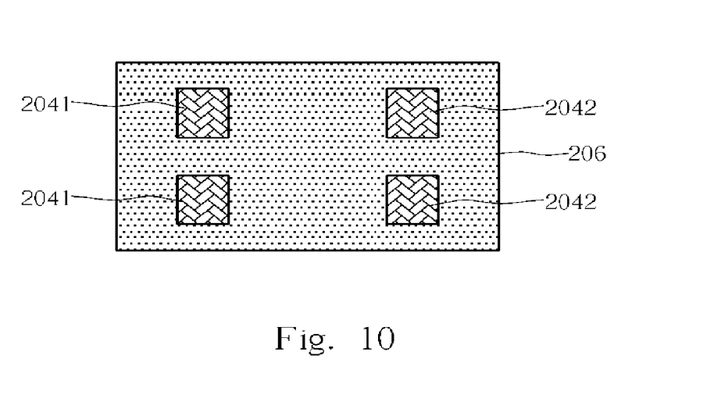
Figure 11:
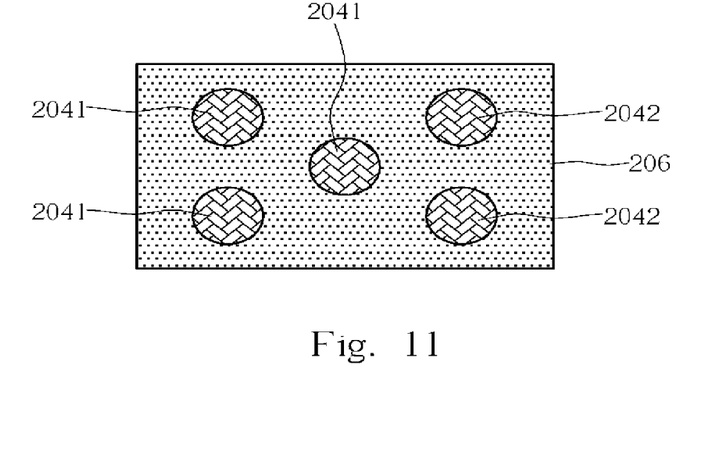

Please refer to FIG. 9. FIG. 9 is a schematic upward view of the bumps of the conductive structure according to the present invention. As shown in FIG. 9, the upward view of both the first conductive part 2041 and the second conductive part 2042 is rectangular. The shape of these two conductive parts can also be square, as shown in FIG. 10 or circular, as shown in FIG. 11. Essentially, a bump should include at least one conductive part, such as the two conductive parts 2041 and 2042 as shown in FIG. 9, or a plurality of conductive parts 2041 and 2042, as shown in FIG. 10 and FIG. 11. As long as the conductive connection part 208 is electrically connected to the contact of the integrated circuit 202, the first conductive part 2041 and the second conductive part 2042 can be triangular, tetragonal, polygonal, cylindrical, or elliptical.

Figure 12:
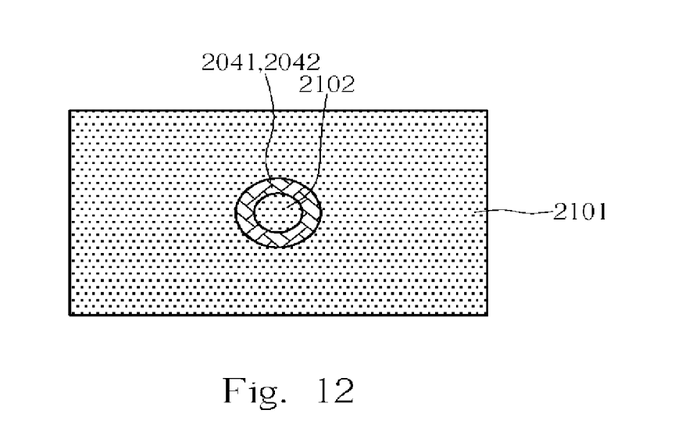
FIGS. 12 and 13 show another embodiment of the bumps of the conductive structure according to the present invention.
Figure 13:
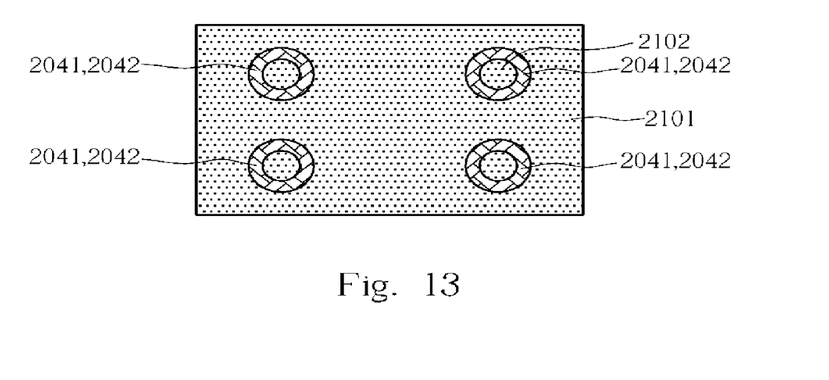

Please refer to FIGS. 12 and 13. FIG. 12 and FIG. 13 show another embodiment of the bumps of the conductive structure according to the present invention. As shown in FIG. 12, the first conductive part 2041 and the second conductive part 2042 are a monolithically-formed structure. The structure has a hollow region in the center. The second insulation part 2102 is located within the hollow region, and the first conductive part 2041 and the second conductive part 2042 are surrounded by the first insulation part 2101. As shown in FIG. 13, a plurality of the first conductive part 2041 and the second conductive part 2042 comprising the hollow region in the center are utilized for forming the bumps of the present invention. In FIG. 13, the second insulation part 2102 is also located within the hollow region and the first conductive part 2041 and the second conductive part 2042 are surrounded by the first insulation part 2101.

Figure 14:
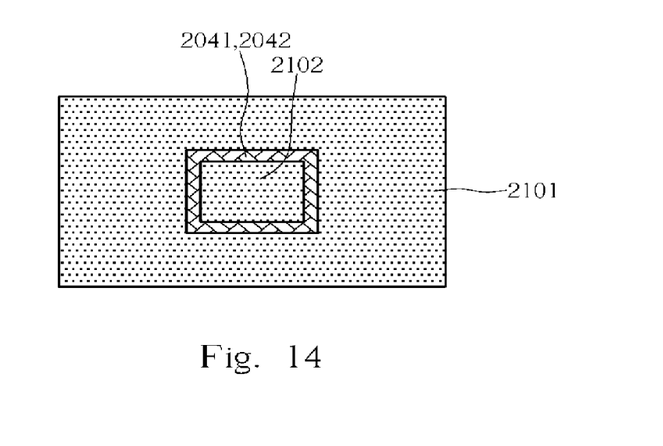
FIGS. 14 and 15 show another embodiment of the bumps of the conductive structure according to the present invention.
Figure 15:
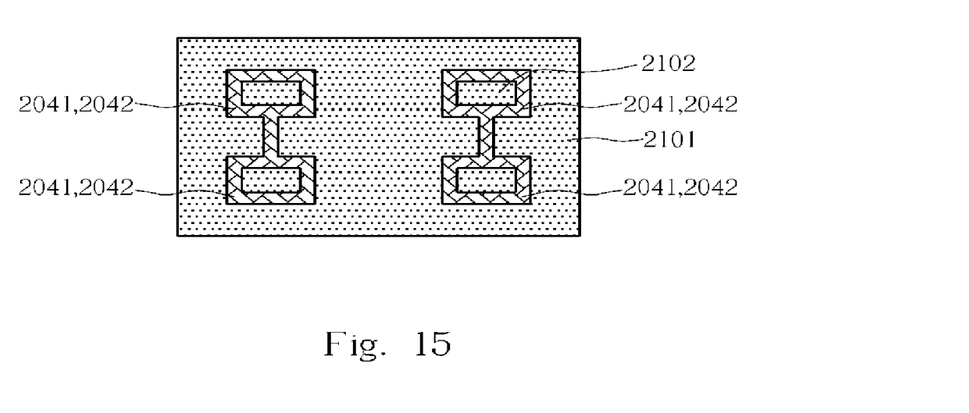

Please refer to FIG. 14 and FIG. 15. FIG. 14 and FIG. 15 show another embodiment of the bumps of the conductive structure according to the present invention. As shown in FIG. 14, the first conductive part 2041 and the second conductive part 2042 are a monolithically-formed structure. The structure has a square hollow region in the center. The second insulation part 2102 is located within the hollow region, and the first conductive part 2041 and the second conductive part 2042 are surrounded by the first insulation part 2101. As shown in FIG. 15, a plurality of the first conductive part 2041 and the second conductive part 2042 comprising the square hollow region are utilized for forming the bumps of the present invention. In FIG. 15, the second insulation part 2102 is also located within the square hollow region and the first conductive part 2041 and the second conductive part 2042 are surrounded by the first insulation part 2101. In this embodiment, the first conductive part 2041 and the second conductive part 2042 neighboring to each other can be interconnected to form an even stronger structure.

Figure 16:
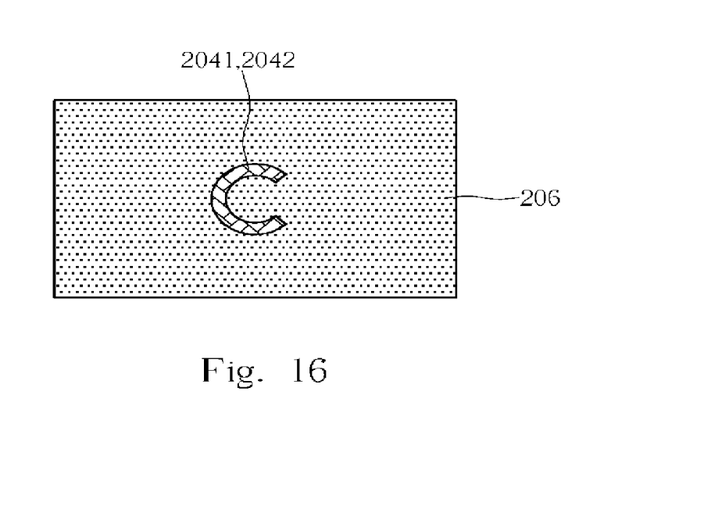
FIGS. 16 and 17 show another embodiment of the bumps of the conductive structure according to the present invention.
Figure 17:
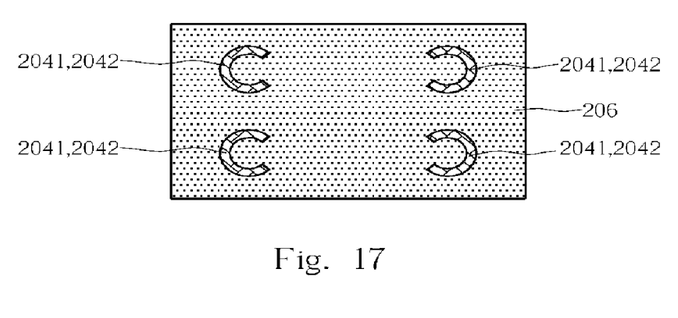

Please refer to FIG. 16 and FIG. 17. FIG. 16 and FIG. 17 show another embodiment of the bumps of the conductive structure according to the present invention. This embodiment is essentially a variation derived from the embodiment shown in FIG. 12 and FIG. 13. As shown in FIG. 16, the first conductive part 2041 and the second conductive part 2042 are a monolithically-formed structure. The first conductive part 2041 and the second conductive part 2042 also form a hollow post that includes an opening. The external first insulation part 2101 and the internal second insulation part 2102 form a monolithically-formed structure that eventually becomes the insulation layer 206. As shown in FIG. 17, a plurality of the first conductive part 2041 and the second conductive part 2042 comprising the hollow post are utilized for forming the bumps of the present invention.

Since the integrated circuit 202 and the glass substrate 212 are composed of hard and rigid materials, a modified conductive bump can be further utilized according to the present invention to increase the tolerance level of the COG technique to the smoothness of the glass substrate. The modified conductive bump includes a buffer layer that is capable of undergoing deformation during a connection. The buffer layer deformation is able to compensate for connection problems caused by uneven contact between the bumps and the glass substrate and the height of the bumps, and consequently increases fabrication variability and production yield. In addition, a multi-layered metal layer is formed on top of the buffer layer. The multi-layered metal layer is composed of an adhesion layer, a shielding layer, and a protective layer and the conductive bump is positioned on top of the metal layer. Characterized by having a buffer layer with low Young's modulus, the conductive bump ensures a much tighter connection during an affixing process and also prevents having uneven electrical resistance at the point of contact.

In contrast to the prior art, the present invention introduces the conductive structure to provide distinguishing features including bendable and compressible bumps that are insulated from each other horizontally, thereby effectively reducing the production cost, reducing the final product size, and increasing the product yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A conductive structure comprising:
   an integrated circuit;
   a substrate; and
   a plurality of bumps positioned in between the integrated circuit and the substrate
   wherein at least one of the bumps comprises:
      a first conductive part connected to the integrated circuit at one end;
      a second conductive part connected to the integrated circuit at one end;
      a conductive connection part connecting the first conductive part and the second conductive part;
      a first insulation part surrounding the first conductive part and the second conductive part, wherein the height of the first conductive part and the second conductive part is H1, the height of the conductive connection part is H2, the height of the first insulation part is H3, and H1≦H3≦H1+H2; and
      a second insulation part positioned in between the first conductive part and the second conductive part.

2. The conductive structure of claim 1 wherein an anisotropic conductive film (ACF) is positioned in between the integrated circuit and the substrate for providing an electrical connection between the conductive connection part and the substrate.

3. The conductive structure of claim 1 wherein the first conductive part and the second conductive part comprise gold, nickel, gold alloy, or nickel alloy.

4. The conductive structure of claim 1 wherein the conductive connection part comprises gold or gold alloy.

5. The conductive structure of claim 1 wherein the first insulation part and the second insulation part comprise light-isolating materials.

6. The conductive structure of claim 5 wherein the light-isolating material of the first insulation part and the second insulation part is polyimide.

7. The conductive structure of claim 1 wherein the first insulation part and the second insulation part are a monolithically-formed structure.

8. The conductive structure of claim 1 wherein the first conductive part includes a first hollow section.

9. The conductive structure of claim 1 wherein the second conductive part includes a second hollow section.

10. The conductive structure of claim 1 wherein the first conductive part is a post.

11. The conductive structure of claim 10 wherein the post is a triangular post, a tetragonal post, a polygonal post a cylindrical post, or an elliptical post.

12. The conductive structure of claim 1 wherein the second conductive part is a post.

13. The conductive structure of claim 12 wherein the post is a triangular post, a tetragonal post, a polygonal post, a cylindrical post, or an elliptical post.

14. The conductive structure of claim 1 wherein the first conductive part and the second conductive part are a monolithically-forned post.

15. The conductive structure of claim 14 wherein the post is a hollow post.

16. The conductive structure of claim 15 wherein the second insulation part is located inside the hollow post.

17. The conductive structure of claim 16 wherein the hollow post includes an opening.

18. The conductive structure of claim 17 wherein the first insulation part and the second insulation part are a monolithically-formed structure.

19. A liquid crystal display comprising:
a substrate;
a liquid crystal display region positioned in the center of the substrate;
an integrated circuit positioned on the edge of the substrate;
a plurality of bumps positioned in between the substrate and the integrated circuit for electrically connecting the integrated circuit; and
an anisotropic conductive film for providing an electrical connection between the bumps and the substrate, wherein the plurality of bumps further comprises:
 a first conductive part connected to the integrated circuit at one end;
 a second conductive part connected to the integrated circuit at one end;
 a conductive connection part connecting the first conductive part and the second conductive part;
 a first insulation part surrounding the first conductive part and the second conductive part, wherein the height of the first conductive part and the second conductive part is H1 the height of the conductive connection part is H2. the height of the first insulation part is H3, and H1≦H3≦H1+H2; and
 a second insulation part positioned in between the first conductive part and the second conductive part.

20. The liquid crystal display of claim 19 wherein the first conductive part and the second conductive part comprises gold, nickel, gold alloy, or nickel alloy.

21. The liquid crystal display of claim 19 wherein the conductive connection part comprises gold or gold alloy.

22. The liquid crystal display of claim 19 wherein the first insulation part and the second insulation part comprise light-isolating materials.

23. The liquid crystal display of claim 19 wherein the light-isolating material of the first insulation part and the second insulation part is polyimide.

24. The liquid crystal display of claim 19 wherein the first insulation part and the second insulation part are a monolithically-formed structure.

25. The liquid crystal display of claim 19 wherein the first conductive part includes a first hollow section.

26. The liquid crystal display of claim 19 wherein the second conductive part includes a second hollow section.

27. The liquid crystal display of claim 19 wherein the first conductive part is a post.

28. The liquid crystal display of claim 27 wherein the post is a triangular post, a tetragonal post, a polygonal post, a cylindrical post, or an elliptical post.

29. The liquid crystal display of claim 28 wherein the second conductive part is a post.

30. The liquid crystal display of claim 29 wherein the post is a triangular post, a tetragonal post, a polygonal post, a cylindrical post, or an elliptical post.

31. The liquid crystal display of claim 19 wherein the first conductive part and the second conductive part are a monolithically-formed post.

32. The liquid crystal display of claim 31 wherein the post is a hollow post.

33. The liquid crystal display of claim 32 wherein the second insulation part is located inside the hollow post 34. The liquid crystal display of claim 33 wherein the hollow post includes an opening.

35. The liquid crystal display of claim 34 wherein the first insulation part and the second insulation part are monolithically-formed structure.

* * * * *